(12) United States Patent
Lee et al.

(10) Patent No.: US 12,512,842 B2
(45) Date of Patent: Dec. 30, 2025

(54) DIGITAL PHASE LOCKED LOOP AND METHODS OF OPERATING SAME

(71) Applicant: Samsung Electronics Co., Ltd., Suwon-si (KR)

(72) Inventors: Yongsun Lee, Suwon-si (KR); Jaewoo Park, Suwon-si (KR); Myoungbo Kwak, Suwon-si (KR); Jinook Jung, Suwon-si (KR); Junghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 18/765,582

(22) Filed: Jul. 8, 2024

(65) Prior Publication Data

US 2024/0364351 A1    Oct. 31, 2024

Related U.S. Application Data

(63) Continuation of application No. 18/189,599, filed on Mar. 24, 2023, now Pat. No. 12,063,044.

(30) Foreign Application Priority Data

Aug. 9, 2022    (KR) .................. 10-2022-0099508

(51) Int. Cl.
*H03L 7/093* (2006.01)
*H03L 7/081* (2006.01)
*H03L 7/099* (2006.01)

(52) U.S. Cl.
CPC ............ *H03L 7/093* (2013.01); *H03L 7/0818* (2013.01); *H03L 7/0991* (2013.01)

(58) Field of Classification Search
CPC ...... H03L 7/093; H03L 7/0818; H03L 7/0991
See application file for complete search history.

(56) References Cited

U.S. PATENT DOCUMENTS 4,718,036 A  *  1/1988  Halbert ............. G01R 31/2834
                                                           375/247
7,482,883 B2     1/2009  Staszewski et al.
(Continued)

FOREIGN PATENT DOCUMENTS

KR    20220027737 A        3/2022
KR    20240021038 A  *     2/2024   ............. H03L 7/093

OTHER PUBLICATIONS

Kodama et al. "A high frequency resolution Digitally-Controlled Oscillator using single-period switching scheme" 2011 Proceedings of the ESSCIRC (Sep. 2011).

(Continued)

*Primary Examiner* — Adam D Houston
(74) *Attorney, Agent, or Firm* — Wolf, Greenfield & Sacks, P.C.

(57) ABSTRACT

A digital phase-locked loop (PLL) includes: (i) a digitally controlled oscillator (DCO) configured to generate an oscillation signal having a frequency that is adjustable in response to a frequency control signal, (ii) a divider configured to generate a feedback signal in response to dividing a frequency of the oscillation signal, (iii) a time-to-digital converter (TDC) configured to detect a phase difference between a reference signal and the feedback signal, and generate an error signal having a value that is a function of the phase difference, and (iv) a digital loop filter configured to generate the frequency control signal in response to the error signal and the oscillation signal.

14 Claims, 16 Drawing Sheets

(56) References Cited

U.S. PATENT DOCUMENTS

| | | | |
|---|---|---|---|
| 8,077,822 B2 | 12/2011 | Sun et al. | |
| 8,193,866 B2* | 6/2012 | Chang | H03L 7/0991 |
| | | | 331/34 |
| 8,901,975 B2* | 12/2014 | Navid | H03L 7/14 |
| | | | 327/147 |
| 9,614,537 B1 | 4/2017 | Nandwana et al. | |
| 9,831,880 B1* | 11/2017 | Kuan | H03L 7/093 |
| 10,340,927 B1* | 7/2019 | Gambhir | H03L 7/1075 |
| 10,355,702 B2* | 7/2019 | Gao | H03L 7/0891 |
| 10,715,155 B1* | 7/2020 | Parvizi | H03L 7/089 |
| 10,895,850 B1* | 1/2021 | Elkholy | G04F 10/005 |
| 11,018,679 B1* | 5/2021 | Jayakumar | H03L 7/0993 |
| 11,038,521 B1* | 6/2021 | Rafi | H03M 7/3024 |
| 11,211,936 B1* | 12/2021 | Tsai | H03L 7/0818 |
| 11,595,048 B1* | 2/2023 | Harush | H03L 7/087 |
| 11,677,404 B1* | 6/2023 | Harush | H03L 7/093 |
| | | | 327/159 |
| 11,764,802 B1* | 9/2023 | Harush | H03M 1/502 |
| | | | 331/18 |
| 11,909,405 B1* | 2/2024 | Grimaldi | H03L 7/085 |
| 12,191,871 B2* | 1/2025 | Shumaker | G04F 10/005 |
| 12,255,660 B2* | 3/2025 | Harush | H03L 7/093 |
| 2006/0091967 A1* | 5/2006 | Iozsef | H03K 3/0315 |
| | | | 331/57 |
| 2008/0218282 A1 | 9/2008 | Waheed et al. | |
| 2009/0096535 A1* | 4/2009 | Chang | H03L 7/085 |
| | | | 331/17 |
| 2014/0266346 A1 | 9/2014 | Park et al. | |
| 2017/0201260 A1* | 7/2017 | Unruh | G04F 10/005 |
| 2017/0205772 A1* | 7/2017 | Burg | H03L 7/18 |
| 2019/0214999 A1* | 7/2019 | Yu | H03L 7/18 |
| 2022/0038104 A1* | 2/2022 | Lee | H03L 7/099 |
| 2022/0216876 A1* | 7/2022 | Tsai | H03L 7/0814 |
| 2022/0278690 A1* | 9/2022 | Shumaker | G04F 10/005 |
| 2023/0253970 A1* | 8/2023 | Tsai | H03L 7/0818 |
| | | | 327/158 |
| 2024/0007113 A1* | 1/2024 | Harush | G04F 10/005 |
| 2024/0056084 A1* | 2/2024 | Lee | H03L 7/093 |
| 2024/0080031 A1* | 3/2024 | Pavlovic | H03C 3/095 |
| 2024/0364351 A1* | 10/2024 | Lee | H03L 7/0818 |

OTHER PUBLICATIONS

Kuan et al. "A Bang Bang Phase-Locked Loop Using Automatic Loop Gain Control and Loop Latency Reduction Techniques" IEEE Journal of Solid-State Circuits 51(4):821-831 (Apr. 2016).

Lee et al. "A -240dB-FoMjitter and -115dBc/Hz PN @ 100kHz, 7.7GHz Ring-DCO-Based Digital PLL Using P/I-Gain Co-Optimization and Sequence-Rearranged Optimally Spaced TDC for Flicker-Noise Reduction" 2020 IEEE International Solid-State Circuits Conference.

Seong et al. "A 320-fs RMS Jitter and -75-dBc Reference-Spur Ring-DCO-Based Digital PLL Using an Optimal-Threshold TDC" IEEE Journal of Solid-State Circuits 54(9):2501-2512 (Jun. 17, 2019).

* cited by examiner

DIGITAL PHASE LOCKED LOOP AND METHODS OF OPERATING SAME

CROSS-REFERENCE TO RELATED APPLICATION

This application is a continuation of and claims priority to U.S. patent application Ser. No. 18/189,599, filed Mar. 24, 2023, which claims priority under 35 U.S.C. § 119 to Korean Patent Application No. 10-2022-0099508, filed Aug. 9, 2022, the disclosures of which are incorporated herein by reference in their entireties.

BACKGROUND

The inventive concept relates to integrated circuit devices and, more particularly, to a digital phase locked loop and a method of operating the digital phase locked loop.

Phase locked loops (PLLs) may generate a phase-fixed clock signal. For example, the clock signal may be used to transmit data from a transmitter or recover data in a receiver. PLLs may be categorized into analog PLLs or digital PLLs. Digital PLLs may be implemented to occupy an area that is less than that of analog PLLs, and may be relatively easier to reconfigure. As high-speed interfaces, such as peripheral component interconnect express (PCIe)) interfaces, have advanced, the need for digital PLLs having low jitter has increased.

SUMMARY

The inventive concept relates to a digital phase locked loop (PLL) having relatively low jitter characteristics, which are provided by adjustable gain and adjustable duty cycle characteristics of a digital loop filter.

According to an aspect of the inventive concept, there is provided a digital phase locked loop including: (i) a digitally controlled oscillator (DCO), which is configured to generate an oscillation signal having a frequency that is adjustable based on a frequency control signal, (ii) a divider, which is configured to generate a feedback signal in response to dividing a frequency of the oscillation signal, (iii) a time-to-digital converter (TDC), which is configured to detect a phase difference between a reference signal and the feedback signal and generate an error signal corresponding to the phase difference, and (iv) a digital loop filter configured to receive the error signal and the oscillation signal (as feedback) and generate the frequency control signal. The digital loop filter includes a gain/duty control circuit, which is configured to control at least one of a gain and a duty cycle of the digital loop filter based on the error signal and the oscillation signal, and a filter circuit, which is configured to filter out noise of the error signal and generate the frequency control signal, based on control by the gain/duty control circuit.

According to another aspect of the inventive concept, there is provided a digital phase locked loop including: (i) a digitally controlled oscillator (DCO) configured to generate an oscillation signal having a frequency that is adjustable based on a frequency control signal, (ii) a divider configured to generate a feedback signal by dividing a frequency of the oscillation signal, (iii) a time-to-digital converter (TDC), which is configured to detect a phase difference between a reference signal and the feedback signal and generate an error signal corresponding to the phase difference, and (iv) a digital loop filter, which is configured to receive the error signal and generate the frequency control signal. The digital loop filter may include a gain control circuit, which is configured to control a gain of the digital loop filter based on the error signal, a duty control circuit, which is configured to control a duty cycle of the digital loop filter based on the error signal and the oscillation signal, and a filter circuit, which is configured to filter out noise of the error signal and generate the frequency control signal based on control by the duty control circuit or the gain control circuit.

According to another aspect of the inventive concept, a method of operating a digital phase locked loop is provided. The operating method includes generating an oscillation signal having a frequency that is adjustable based on a frequency control signal, generating a feedback signal by dividing a frequency of the oscillation signal, detecting a phase difference between a reference signal and the feedback signal, generating an error signal corresponding to the phase difference, controlling a gain of the digital loop filter based on the error signal, and controlling a duty cycle of the digital loop filter based on the error signal and the oscillation signal.

According to another aspect of the inventive concept, there is provided a system on chip (SOC) including a digital phase locked loop and an application processor configured to operate in response to an oscillation signal of the digital phase locked loop. The digital phase locked loop includes a digitally controlled oscillator (DCO) configured to generate an oscillation signal having a frequency that is adjustable based on a frequency control signal, a divider configured to generate a feedback signal by dividing a frequency of the oscillation signal, a time-to-digital converter (TDC) configured to detect a phase difference between a reference signal and the feedback signal and generate an error signal corresponding to the phase difference, and a digital loop filter configured to receive the error signal to generate the frequency control signal. The digital loop filter may include a filter circuit configured to generate the frequency control signal based on the error signal, and a gain/duty control circuit configured to control at least one of a gain and a duty cycle of the digital loop filter.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, various embodiments will be described in detail with reference to the accompanying drawings.

Figure 1:
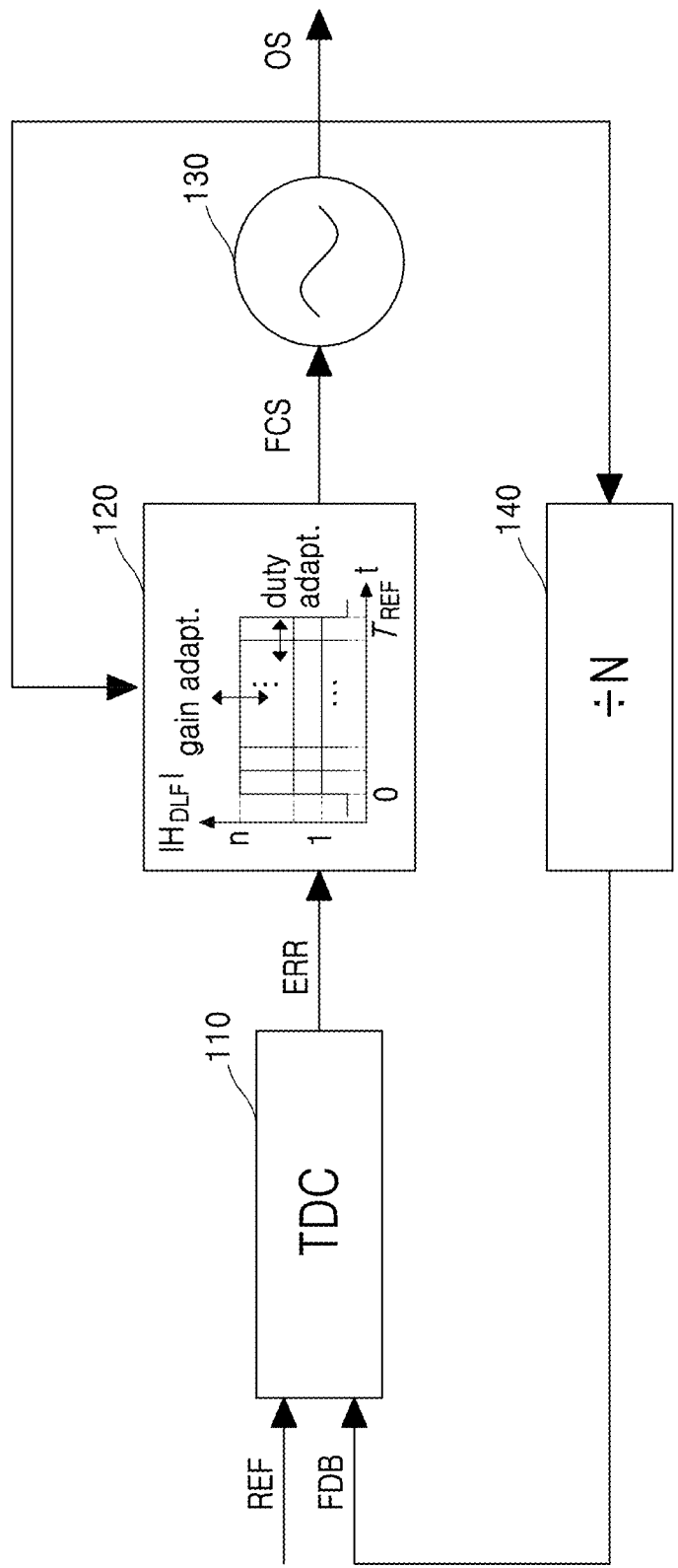
FIG. 1 is a diagram for describing a digital phase locked loop (PLL) according to an embodiment.

FIG. 1 is a diagram for describing a digital phase locked loop (PLL) according to an embodiment. Referring to FIG. 1, the digital PLL may include a time-to-digital converter (TDC) 110, a digital loop filter 120, a digitally-controlled oscillator (DCO) 130, and a divider 140. The digital PLL may compare a reference signal REF with a feedback signal FDB generated based on an oscillation signal OS generated by the DCO 130 and may fix a phase of the oscillation signal OS. Therefore, the DCO 130 may generate the oscillation signal OS having a target frequency which is desired.

The DCO 130 may be an oscillator which generates a target high frequency oscillation signal OS which is to be output, but a frequency of the oscillation signal OS may be much affected by peripheral situations. For example, due to influences of an internal circuit, peripheral equipment, a temperature, and the weather, a frequency of the oscillation signal OS may be finely shaken, and thus, the DCO 130 may output the oscillation signal OS having a frequency having an error from a target frequency. Particularly, as a frequency of the oscillation signal OS increases, an error occurring in the oscillation signal OS may increase due to a noise component.

The divider 140 may generate a feedback signal FDB that is obtained by dividing a frequency of the oscillation signal OS at a division ratio (for example, N (where N is an integer greater than 0)). The divider 140 may include a counter that may generate the feedback signal FDB having a logic state is shifted, based on the division ratio. To provide a detailed description, the counter may count the number of pulses of the oscillation signal OS, and in response to a case where the number of pulses corresponding to the division ratio is input, the counter may shift a logic state of the feedback signal FDB. For example, when the division ratio is 6, the divider 140 may shift a logic state of the feedback signal FDB once in response to counting six pulses of the oscillation signal OS.

The divider 140 may generate the feedback signal FDB and may provide the feedback signal FDB to the TDC 110. The divider 140 may divide a frequency of the oscillation signal OS, which is a high frequency signal, and thus, may provide to the TDC 110 with the feedback signal FDB having a frequency which is relatively lower than that of the oscillation signal OS. The oscillation signal OS may have a frequency which is higher than that of the reference signal REF, and thus, it may not be appropriate for the TDC 110 c to directly compare a phase difference between the oscillation signal OS and the reference signal REF. Accordingly, the divider 140 may divide a frequency of the oscillation signal OS at the division ratio to generate the feedback signal FBD and may provide the feedback signal FBD to the TDC 110.

The TDC 110 may transmit an error signal ERR to the digital loop filter 120, based on the feedback signal FDB and the reference signal REF received from, for example, a crystal oscillator. However, a form of an oscillator is not limited thereto, and may include various forms of oscillators that may be configured to generate an oscillating signal. The TDC 110 may include a comparator, and the comparator may generate the error signal ERR representing a phase difference between the feedback signal FDB and the reference signal REF, based on a difference between the feedback signal FDB and the reference signal REF.

For example, when a difference between the feedback signal FDB and the reference signal REF occurs, the TDC 110 may generate the error signal ERR of 0. Additionally, when there is a difference between the feedback signal FDB and the reference signal REF, the TDC 110 may generate the error signal ERR having a pulse width equal to a period of the difference. The TDC 110 may output the error signal ERR in which a magnitude of a pulse is constant. In addition, a pulse width of the error signal ERR may vary based on a difference between two signals (i.e., the feedback signal FDB and the reference signal REF), and a sign (e.g., positive or negative) may be determined based on a signal having a higher level among the two signals.

The TDC 110 may detect a phase difference between the feedback signal FDB and the reference signal REF having a continuous value and generate the error signal ERR having a discrete value. Here, the quantization error may occur which is an error between the continuous value and the discrete value. As the TDC 130 generates the oscillation signal OS having a high frequency, the TDC 110 may not correctly detect the phase difference between the feedback signal FDB and the reference signal REF due to a limited resolution of the TDC 110. That is, the quantization error may increase a limited resolution of the TDC 110, and the increased quantization error may act as a noise source of the digital PLL to increase root mean square (RMS) jitter of the oscillation signal OS. In an embodiment, the RMS jitter may denote a value representing the mean square of a time difference between the oscillation signal OS having a target frequency and an actual output oscillation signal OS.

The digital loop filter 120 may receive the error signal ERR and the oscillation signal OS and may generate a frequency control signal FCS for controlling a frequency of the oscillation signal OS, based on the error signal ERR and/or the oscillation signal OS. The digital loop filter 120 may adjust at least one of a gain and a duty cycle of the digital loop filter 120, based on the error signal ERR and/or the oscillation signal OS. In an embodiment, a duty cycle may denote a ratio of a time for which a pulse signal (for example, the error signal ERR) is activated in a period $T_{REF}$ of the reference signal REF. The digital loop filter 120 may adjust a gain or a duty cycle to adjust the frequency control signal FCS. The oscillation signal OS output from the DCO 130 may also be adjusted based on the frequency control signal FCS, and thus, the RMS jitter of the oscillation signal OS may be reduced. Accordingly, the digital loop filter 120 may offset all or a portion of the quantization error which occurs due to the limited resolution of the TDC 110. Furthermore, the digital loop filter 120 may include a low pass filter for providing the frequency control signal FCS having a direct current (DC) component to the DCO 130, and thus, may remove an undesired noise component except the frequency control signal FCS.

The DCO 130 may receive the frequency control signal FCS and may adjust a frequency of the oscillation signal OS output based on the frequency control signal FCS. For example, when the DCO 130 receives a positive frequency control signal FCS, the DCO 130 may output a frequency which is higher than that of a conventional oscillation signal OS, and thus, may output the oscillation signal OS having the target frequency.

Figure 2A:
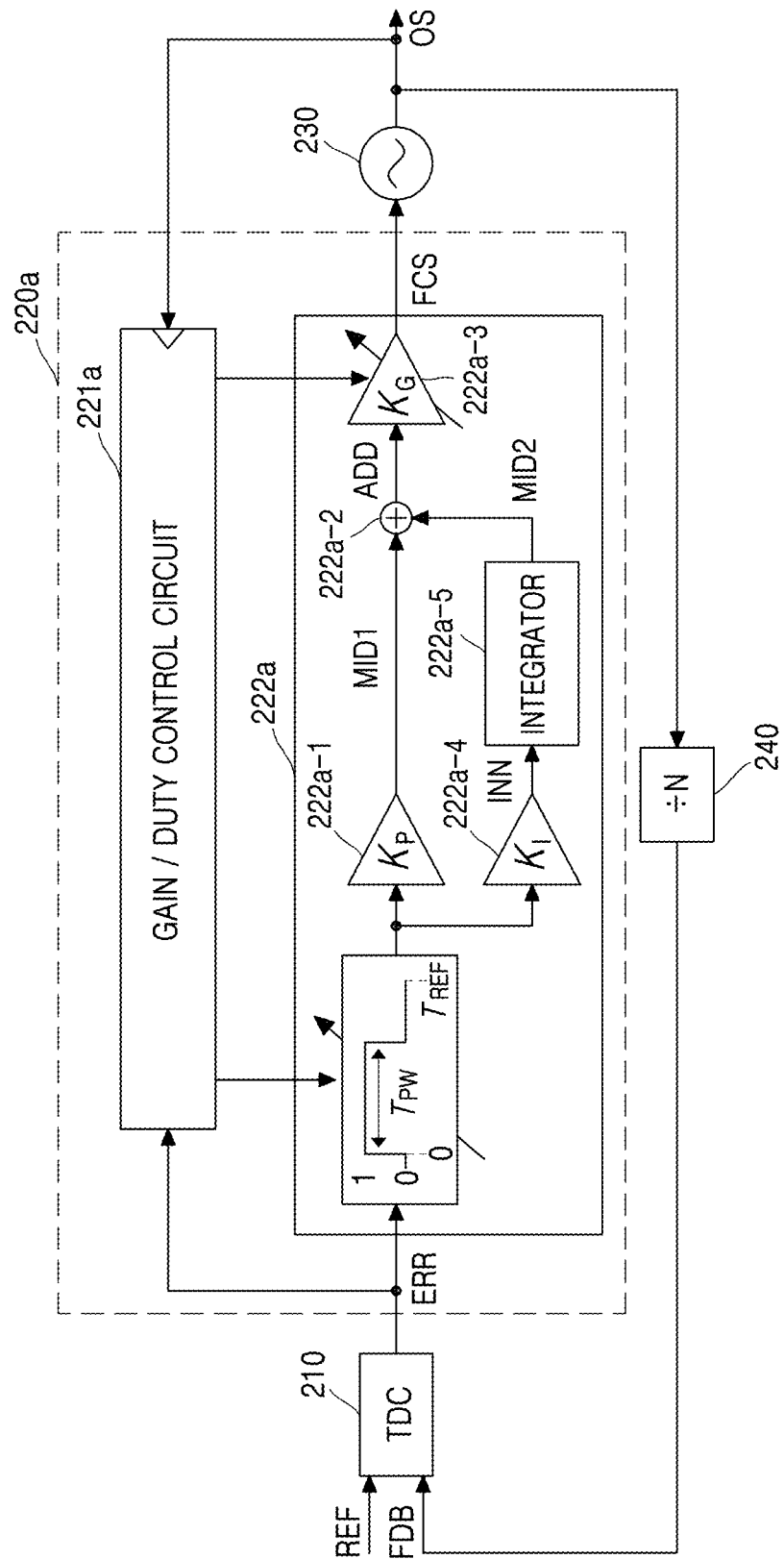
FIGS. 2A and 2B are block diagrams for describing a digital PLL according to an embodiment.
Figure 2B:
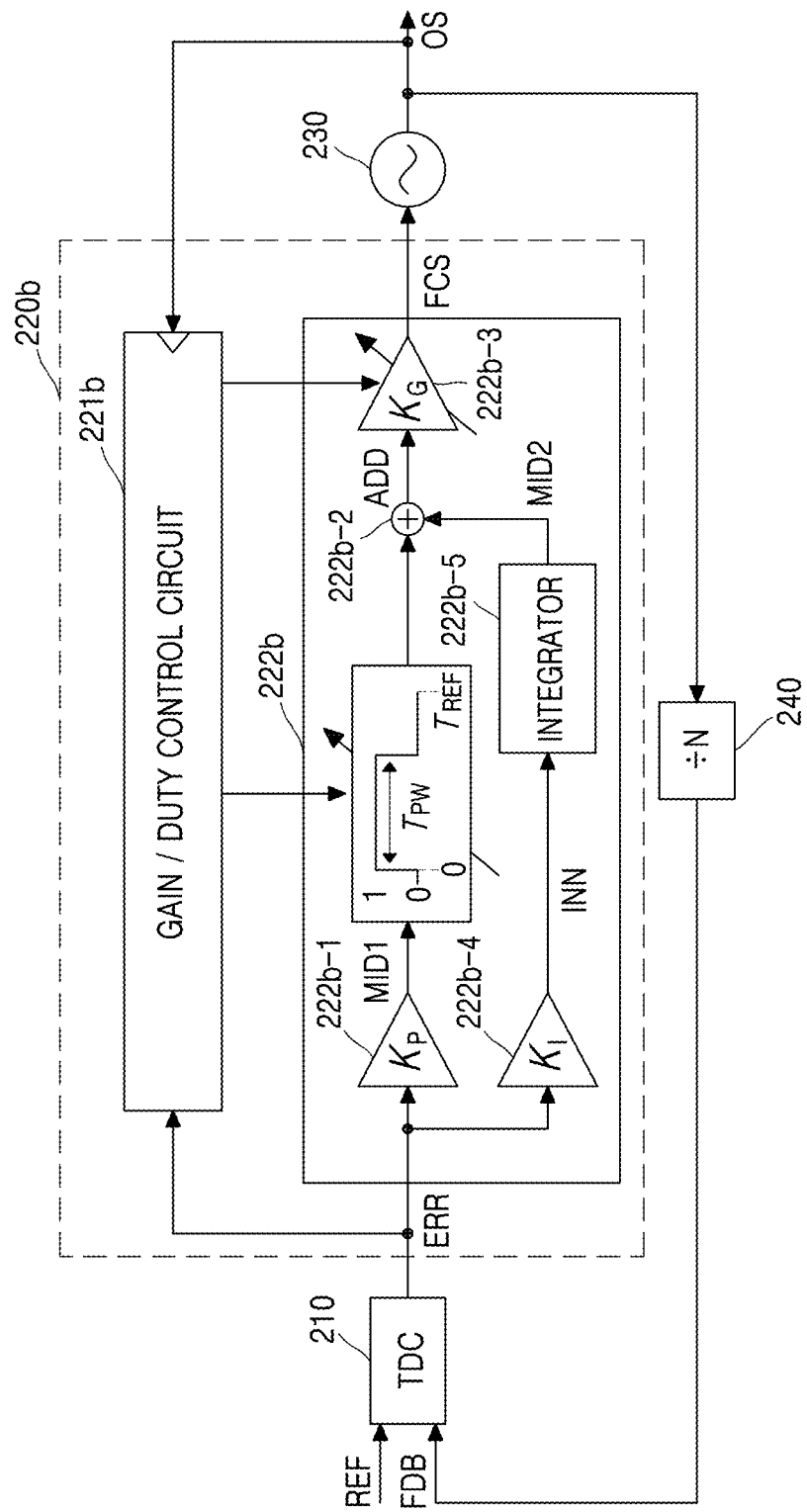

FIGS. 2A and 2B are block diagrams for describing a digital PLL according to an embodiment. In particular, FIG. 2A illustrates a case where a duty cycle of a digital loop filter is controlled before multiplying an error signal by a proportional gain, whereas FIG. 2B illustrates a case where a duty cycle of a digital loop filter is controlled after multiplying an error signal by a proportional gain. Hereinafter, descriptions which are the same as or similar to descriptions given above with reference to FIG. 1 may be omitted.

Referring to FIG. 2A, the digital PLL may include a TDC 210, a digital loop filter 220a, a DCO 230, and a divider 240. The TDC 210 may transmit an error signal ERR to the digital loop filter 220a, based on a feedback signal FDB and a reference signal REF received from, for example, a crystal oscillator. The error signal ERR may represent a phase difference between the feedback signal FDB and the reference signal REF.

The digital loop filter 220a may include a gain/duty control circuit 221a and a filter circuit 222a. The gain/duty control circuit 221a may adjust at least one of a gain and a duty cycle of the digital loop filter 220a, based on the error signal ERR received from the TDC 210 and/or the oscillation signal OS received from the DCO 230.

The gain/duty control circuit 221a may adjust a gain of the filter circuit 222a, based on the error signal ERR. In some embodiments, the gain/duty control circuit 221a may calculate an auto correlation of the error signal ERR, and then, may increase or decrease a gain of the digital loop filter 220a, based on a value of the auto correlation. Here, the auto correlation may be expressed as the following Equation 1 (where N may denote the number of timing points of the error signal ERR, and p may be an integer of 0 or more):

$$R[p] = \frac{1}{N} * \sum_{n=0}^{N-1} err[n] * err[n+p]$$

For example, when the auto correlation of the error signal ERR is a negative number, the gain/duty control circuit 221a may decrease a gain of the digital loop filter 220a. On the other hand, when the auto correlation of the error signal ERR is a positive number, the gain/duty control circuit 221a may increase a gain of the digital loop filter 220a. Also, when the auto correlation of the error signal ERR is 0, this may denote that the RMS jitter of the oscillation signal OS is minimally reduced. Therefore, when the auto correlation of the error signal ERR is 0, the gain/duty control circuit 221a may intactly maintain a gain of the digital loop filter 220a.

The filter circuit 222a may include a proportional amplifier 222a-1, an adder 222a-2, a gain amplifier 222a-3, an integral amplifier 222a-4, and an integrator 222a-5. The filter circuit 222a may receive the error signal ERR and may generate the frequency control signal FCS, based on control by the gain/duty control circuit 221a. In detail, the filter circuit 222a may vary a duty cycle of the error signal ERR, based on control by the gain/duty control circuit 221a. For example, the filter circuit 222a may receive duty cycle information corresponding to $T_{PW}/T_{REF}$ from the gain/duty control circuit 221a (where $T_{PW}$ may represent a duration time of a pulse, and $T_{REF}$ may represent a period of a reference signal). In this case, the filter circuit 222a may provide the error signal ERR to the proportional amplifier 222a-1 having a proportional gain $K_P$ value and the integral amplifier 222a-4 having an integral gain $K_I$ value for $T_{PW}$ time in $T_{REF}$ time. On the other hand, the filter circuit 222a may not provide the error signal ERR to the proportional amplifier 222a-1 and the integral amplifier 222a-4 for a time except $T_{PW}$ time in $T_{REF}$ time.

The proportional amplifier 222a-1 may multiply the error signal ERR by the proportional gain $K_P$ to generate a first middle signal MID1. The integral amplifier 222a-4 may multiply the error signal ERR by the integral gain $K_I$ to generate an internal signal INN. The integrator 222a-5 may accumulate the internal signal INN to generate a second middle signal MID2. The adder 222a-2 may receive the first middle signal MID1 and the second middle signal MID2 and may summate the first middle signal MID1 and the second middle signal MID2 to generate an addition signal ADD. Based on control by the gain/duty control circuit 221a, the gain amplifier 222a-3 may multiply the addition signal ADD by a variable gain $K_G$ to generate the frequency control signal FCS. In FIG. 2A, it is illustrated that the gain/duty control circuit 221a controls a variable gain $K_G$ value, but in other embodiments, the gain/duty control circuit 221a may control the proportional gain $K_P$ and the integral gain $K_I$.

The DCO 230 may generate the oscillation signal OCS having a frequency corresponding to the frequency control signal FCS. The divider 240 may divide, by a division ratio, a frequency of the oscillation signal OS received from the DCO 230 to generate the feedback signal FDB. The divider 240 may provide the feedback signal FDB to the TDC 210.

Except for that a duty cycle of a digital loop filter 220b is controlled after multiplying an error signal ERR by a proportional gain $K_P$, FIG. 2B may be described with reference to FIG. 2A. Hereinafter, therefore, descriptions which are the same as or similar to descriptions given above with reference to FIG. 2A may be omitted.

A TDC 210 may transmit an error signal ERR to a digital loop filter 220b, based on a feedback signal FDB and a reference signal REF received from, for example, a crystal oscillator. The digital loop filter 220b may include a gain/duty control circuit 221b and a filter circuit 222b. The gain/duty control circuit 221b may adjust at least one of a gain and a duty cycle of the digital loop filter 220b, based on the error signal ERR received from a TDC 210 and/or the oscillation signal OS received from a DCO 230.

The filter circuit 222b may include a proportional amplifier 222b-1, an adder 222b-2, a gain amplifier 222b-3, an integral amplifier 222b-4, and an integrator 222b-5. The proportional amplifier 222b-1 may multiply the error signal ERR by a proportional gain $K_P$ to generate a first middle signal MID1. The filter circuit 222b may vary a duty cycle of the first middle signal MID1, based on control by the gain/duty control circuit 221b. For example, the filter circuit 222b may receive duty cycle information corresponding to $T_{PW}/T_{REF}$ from the gain/duty control circuit 221b (where $T_{PW}$ may represent a duration time of a pulse, and $T_{REF}$ may represent a period of a reference signal). In this case, the filter circuit 222b may provide the first middle signal MID1 to the adder 222b-2 for $T_{PW}$ time in $T_{REF}$ time. On the other hand, the filter circuit 222b may not provide the first middle signal MID1 to the adder 222b-2 for a time except $T_{PW}$ time in $T_{REF}$ time.

The integral amplifier 222b-4 may multiply the error signal ERR by an integral gain $K_I$ to generate an internal signal INN. The integrator 222b-5 may accumulate the internal signal INN to generate a second middle signal MID2. The adder 222b-2 may receive the first middle signal MID1 and the second middle signal MID2 and may summate the first middle signal MID1 and the second middle signal MID2 to generate an addition signal ADD. Based on control by the gain/duty control circuit 221b, the gain amplifier 222b-3 may multiply the addition signal ADD by a variable gain $K_G$ to generate a frequency control signal FCS.

Figure 3:
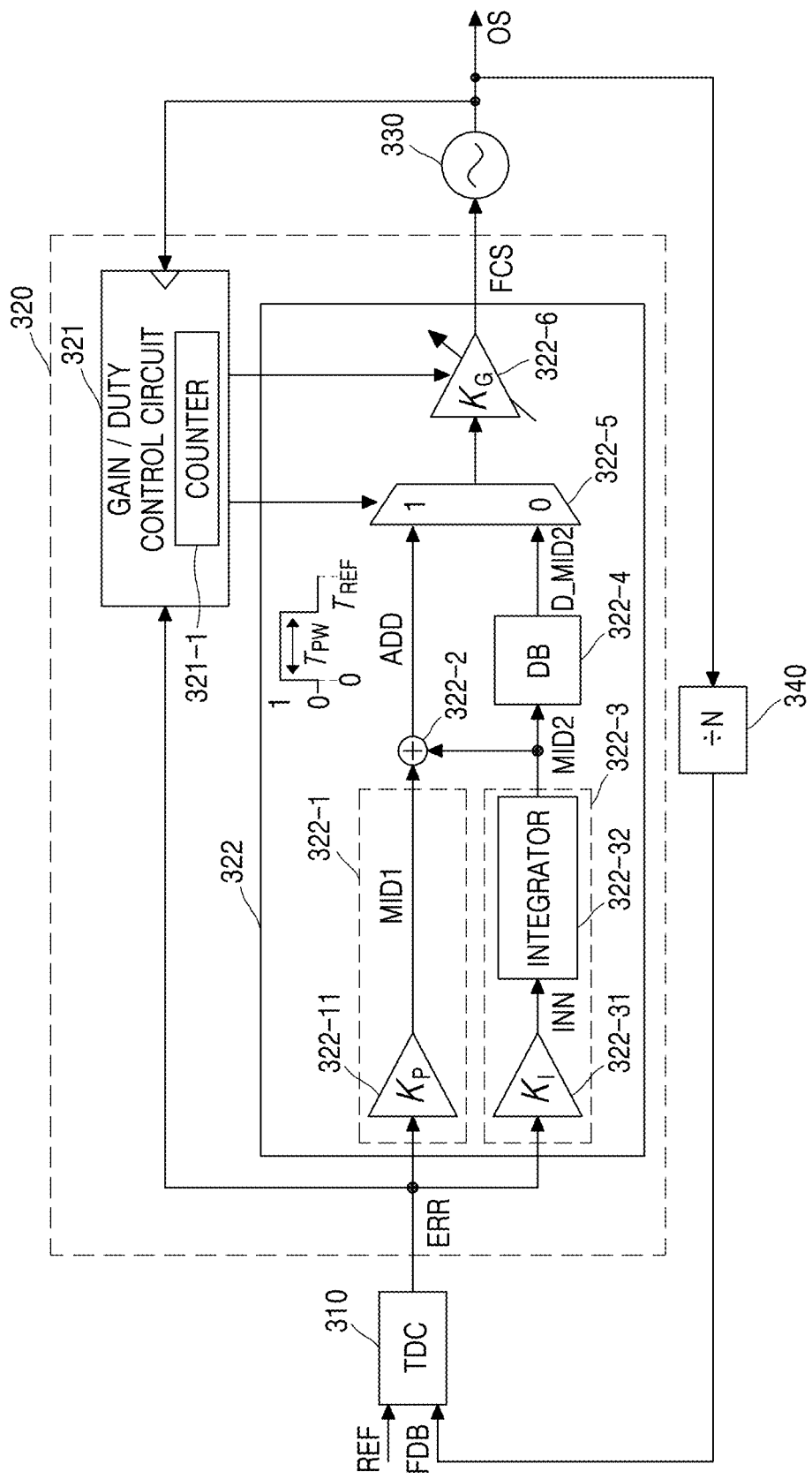
FIG. 3 is a block diagram for describing a structure of a digital PLL according to an embodiment.

FIG. 3 is a block diagram for describing a structure of a digital PLL according to an embodiment. FIG. 3 may denote a case which adjusts a duty cycle of a digital loop filter by using elements such as a multiplexer and a delay block. Referring to FIG. 3, the digital PLL may include a TDC 310, a digital loop filter 320, a DCO 330, and a divider 340. The TDC 310 may transmit an error signal ERR to the digital loop filter 320, based on a feedback signal FDB and a reference signal REF received from, for example, a crystal oscillator. The error signal ERR may represent a phase difference between the feedback signal FDB and the reference signal REF.

The digital loop filter 320 may include a gain/duty control circuit 321 and a filter circuit 322. The gain/duty control circuit 321 may include a counter 321-1. The counter 321-1 may count the number of pulses of an oscillation signal OS received from the DCO 330. The gain/duty control circuit 321 may control a duty cycle of the digital loop filter 320, based on the counted number of pulses of the oscillation signal OS.

For example, when a frequency of the oscillation signal OS is 100 MHz and a frequency of the reference signal REF is 1 MHZ, in a case where the gain/duty control circuit 321 changes an active mode of the filter circuit 322 whenever the number of pulses of the oscillation signal OS is counted 50 times, a duty cycle of the digital loop filter 320 may be $$50 * \frac{0.01 \ \mu s}{1 \ \mu s} = 0.5.$$

Also, the gain/duty control circuit 321 may adjust a gain of the filter circuit 322, based on the error signal ERR. In some embodiments, the gain/duty control circuit 321 may calculate an auto correlation of the error signal ERR, and then, may increase or decrease a gain of the digital loop filter 320, based on a value of the auto correlation. The filter circuit 322 may include a proportional path 322-1, an adder 322-2, an integral path 322-3, a delay block 322-4, a multiplexer 322-5, and a gain amplifier 322-6. The filter circuit 322 may receive the error signal ERR and may generate a frequency control signal FCS, based on control by the gain/duty control circuit 321.

The proportional path 322-1 may include a proportional amplifier 322-11 having the proportional gain $K_P$. The proportional path 322-1 may multiply, by the proportional gain $K_P$, the error signal ERR received from the TDC 310 to generate the first middle signal MID1. The integral path 322-3 may include an integral amplifier 322-31 having the integral gain $K_I$ and an integrator 322-32. The integral amplifier 222b-4 may multiply the error signal ERR by the integral gain $K_I$ to generate an internal signal INN. The integrator 322-32 may accumulate the internal signal INN to generate a second middle signal MID2.

The adder 322-2 may receive the first middle signal MID1 and the second middle signal MID2 and may summate the first middle signal MID1 and the second middle signal MID2 to generate an addition signal ADD. The addition signal ADD may be expressed as the following Equation 2 (where $K_P$ may denote a proportional gain, $K_I$ may denote an integral gain, and ERR[k] may denote a kth error signal):

$$ADD = ERR[n] * K_P + K_I * \sum_{k=1}^{n} ERR[k]$$

Referring to Equation 2, the addition signal ADD may include information about a current error signal ERR[n]. The delay block 322-4 may receive the second middle signal MID2 from the integral path 322-3 to generate a delayed second middle signal D_MID2. For example, the delay block 322-4 may delay the second middle signal MID2 by one period $T_{REF}$ of the reference signal REF to generate the delayed second middle signal D_MID2. The delayed second middle signal D_MID2 may be expressed as the following Equation 3:

$$D\_MID2 = 0 * K_P + K_I * \left( \sum_{k=1}^{n-1} ERR[k] + 0 \right) = K_I * \sum_{k=1}^{n-1} ERR[k]$$

Referring to Equation 3, the delayed second middle signal D_MID2 may not include the information about the current error signal ERR[n]. The multiplexer 322-5 may output one of the delayed second middle signal D_MID2 and the addition signal ADD, based on control by the gain/duty control circuit 321.

The filter circuit 322 may have an active mode or an inactive mode. The active mode may denote a case where the filter circuit 322 outputs the frequency control signal FCS in which the current error signal ERR[n] is reflected. The inactive mode may denote a case where the filter circuit 322 outputs the frequency control signal FCS in which the current error signal ERR[n] is not reflected.

The gain/duty control circuit 321 may transfer a signal corresponding to '1' to the multiplexer 322-5, and thus, may control the multiplexer 322-5 to output the addition signal ADD. That is, the gain/duty control circuit 321 may perform control so that the filter circuit 322 corresponds to the active mode. On the other hand, the gain/duty control circuit 321 may transfer a signal corresponding to '0' to the multiplexer 322-5, and thus, may control the multiplexer 322-5 to output the delayed second middle signal D_MID2. That is, the gain/duty control circuit 321 may perform control so that the filter circuit 322 corresponds to the inactive mode. However, this may be only an embodiment, and the gain/duty control circuit 321 may transfer a signal corresponding to '0' to the multiplexer 322-5 to perform control so that the multiplexer 322-5 outputs the addition signal ADD and may transfer a signal corresponding to '1' to the multiplexer 322-5 to perform control so that the multiplexer 322-5 outputs the delayed second middle signal D_MID2.

Based on control by the gain/duty control circuit 321, the gain amplifier 322-6 may multiply the addition signal ADD or the delayed second middle signal D_MID2 by a variable gain $K_G$ to generate the frequency control signal FCS. The DCO 330 may generate the oscillation signal OCS having a frequency corresponding to the frequency control signal FCS. The divider 340 may divide, by a division ratio, a frequency of the oscillation signal OS received from the DCO 330 to generate the feedback signal FDB. The divider 340 may provide the feedback signal FDB to the TDC 310.

Figure 4A:
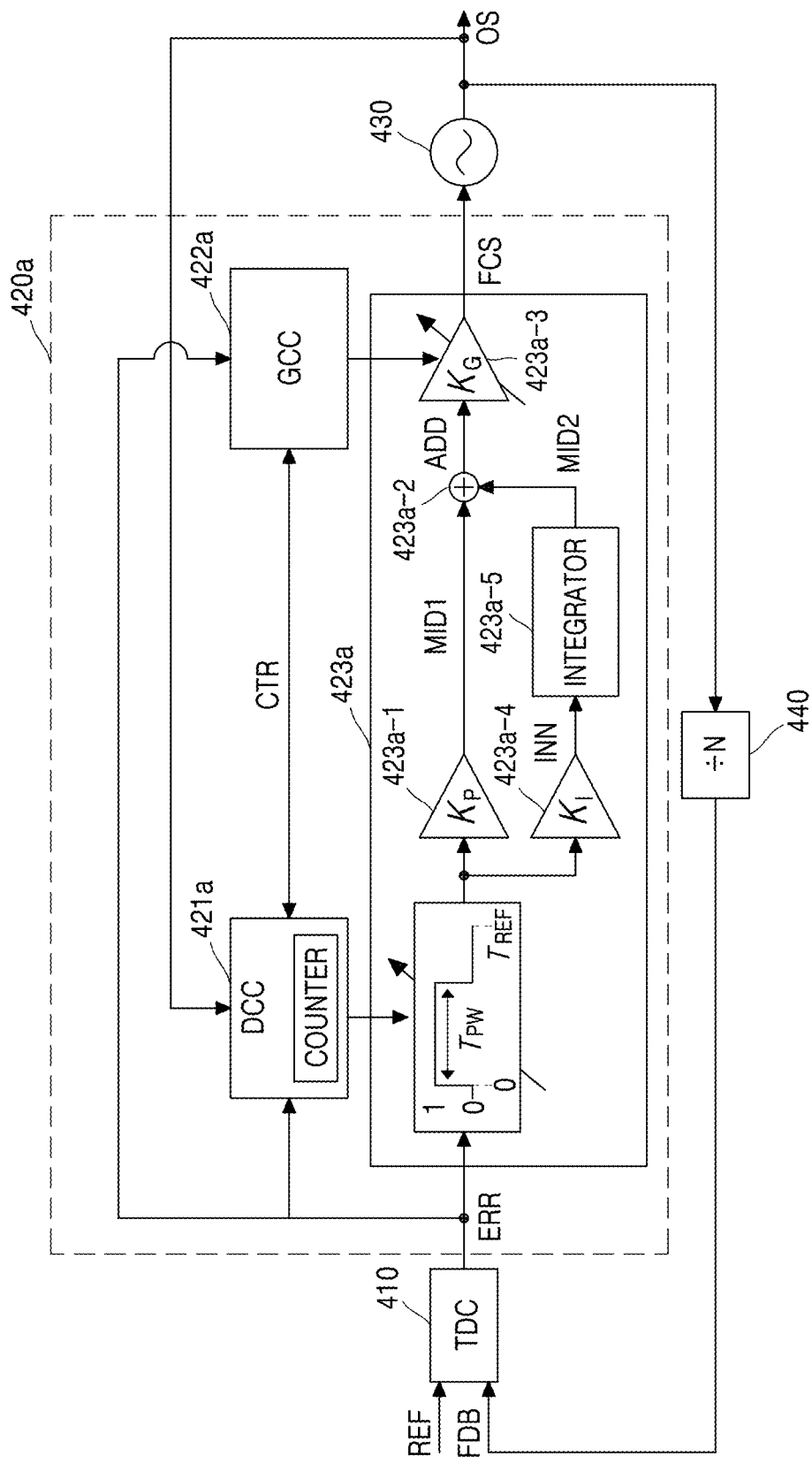
FIGS. 4A and 4B are block diagrams for describing an operation of a digital PLL according to another embodiment.
Figure 4B:
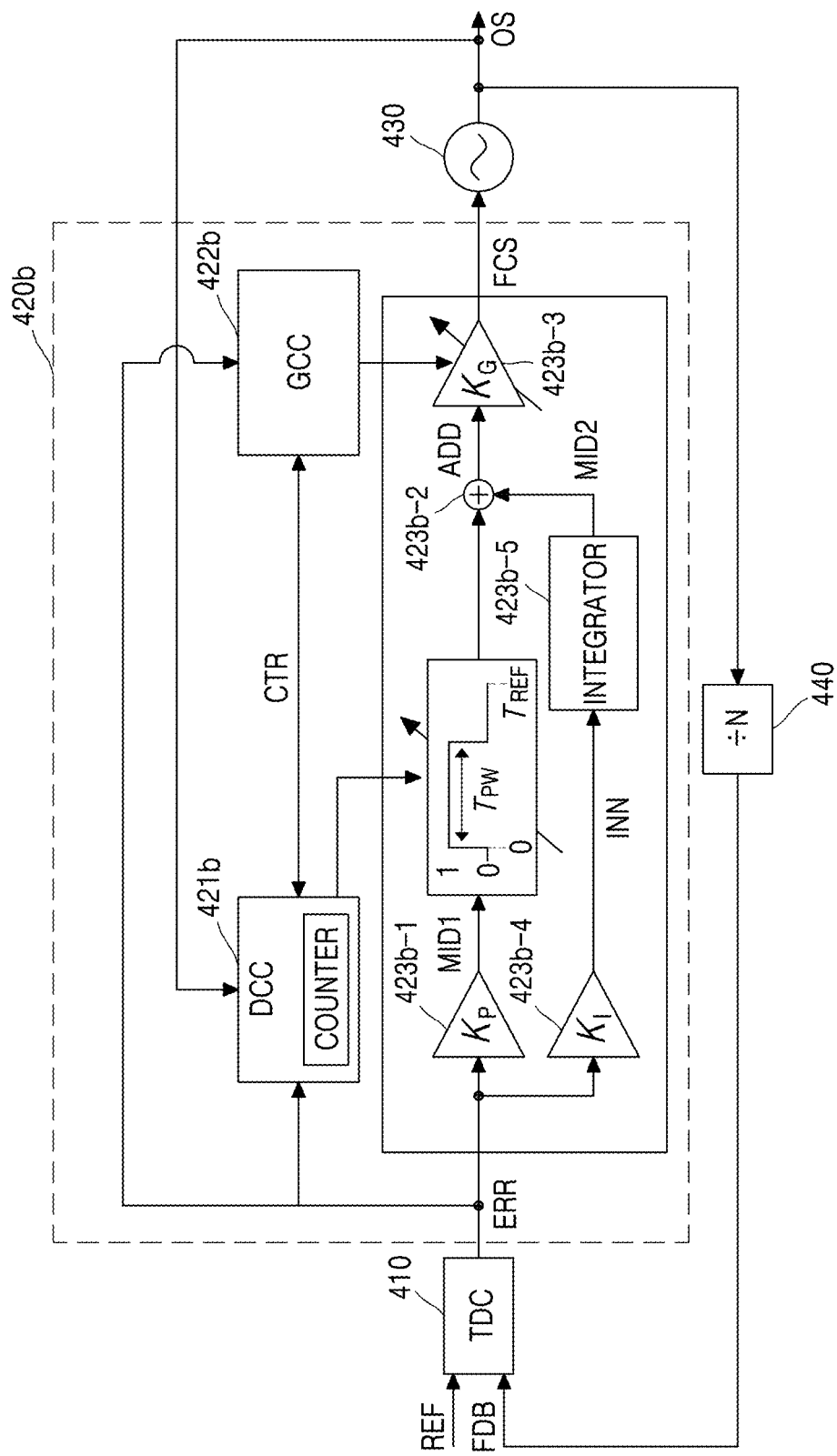

FIGS. 4A and 4B are block diagrams for describing an operation of a digital PLL according to another embodiment. FIG. 4A may denote an embodiment where the gain/duty control circuit 221a of FIG. 2A is divided into and implemented with a gain control circuit 422a for controlling a gain of a digital loop filter and a duty control circuit 421a for controlling a duty cycle of the digital loop filter. Likewise, FIG. 4B may denote an embodiment where the gain/duty control circuit 221b of FIG. 2B is divided into and implemented with a gain control circuit 422b for controlling a gain of a digital loop filter and a duty control circuit 421b for controlling a duty cycle of the digital loop filter. In FIGS. 4A and 4B, except for a difference described above, descriptions which are the same as or similar to descriptions given above with reference to FIGS. 2A and 2B may be omitted.

FIG. 4A illustrates a case where a duty cycle of a digital loop filter is controlled before multiplying an error signal by a proportional gain, and FIG. 4B illustrates a case where a duty cycle of a digital loop filter is controlled after multiplying an error signal by a proportional gain. Referring to FIG. 4, the digital PLL may include a TDC 410, a digital loop filter 420a, a DCO 430, and a divider 440.

The TDC 410 may transmit an error signal ERR to the digital loop filter 420a, based on a feedback signal FDB and a reference signal REF received from, for example, a crystal oscillator. The error signal ERR may represent a phase difference between the feedback signal FDB and the reference signal REF. The digital loop filter 420a may include a duty control circuit 421a, a gain control circuit 422a, and a filter circuit 423a.

The duty control circuit 421a may control a duty cycle of the digital loop filter 420a, based on the error signal ERR and the oscillation signal OS. The gain control circuit 422a may control a gain of the digital loop filter 420a, based on the error signal ERR. In some embodiments, the duty control circuit 421a may calculate an auto correlation of the error signal ERR, and then, may increase or decrease a gain of the digital loop filter 420a, based on a value of the auto correlation.

The duty control circuit 421a and the gain control circuit 422a may transfer or receive control information CTR therebetween. The control information CTR may include information about whether duty cycle control or gain control on the digital loop filter 420a is completed. For example, when the duty control circuit 421a completes the duty cycle control on the digital loop filter 420a, the duty control circuit 421a may transfer the control information CTR, representing that the duty cycle control is completed, to the gain control circuit 422a. The gain control circuit 422a may receive the control information CTR from the duty control circuit 421a, and then, may start the gain control on the digital loop filter 420a. However, this may be only an embodiment, and the gain control circuit 422a may start the gain control before receiving the control information CTR, or the gain control on the digital loop filter 420a may be performed prior to the duty cycle control.

The filter circuit 423a may include a proportional amplifier 423a-1, an adder 423a-2, a gain amplifier 423a-3, an integral amplifier 423a-4, and an integrator 423a-5. The filter circuit 423a may receive the error signal ERR and may generate a frequency control signal FCS, based on control by the duty control circuit 421a and the gain control circuit 422a. The filter circuit 423a may vary a duty cycle of the error signal ERR, based on control by the duty control circuit 421a. For example, the filter circuit 423a may receive duty cycle information corresponding to $T_{PW}/T_{REF}$ from the duty control circuit 421a (where $T_{PW}$ may represent a duration time of a pulse, and $T_{REF}$ may represent a period of a reference signal). In this case, the filter circuit 423a may provide the error signal ERR to the proportional amplifier 222a-1 having a proportional gain $K_P$ value and the integral amplifier 423a-4 having an integral gain $K_I$ value for $T_{PW}$ time in $T_{REF}$ time. On the other hand, the filter circuit 423a may not provide the error signal ERR to the proportional amplifier 423a-1 and the integral amplifier 423a-4 for a time except $T_{PW}$ time in $T_{REF}$ time.

The proportional amplifier 423a-1 may multiply the error signal ERR by the proportional gain $K_P$ to generate a first middle signal MID1. The integral amplifier 423a-4 may multiply the error signal ERR by the integral gain $K_P$ to generate an internal signal INN. The integrator 423a-5 may accumulate the internal signal INN to generate a second middle signal MID2. The adder 423a-2 may receive the first middle signal MID1 and the second middle signal MID2 and may summate the first middle signal MID1 and the second middle signal MID2 to generate an addition signal ADD. Based on control by the gain control circuit 422a, the gain amplifier 423a-3 may multiply the addition signal ADD by a variable gain $K_G$ to generate the frequency control signal FCS. In FIG. 4A, it is illustrated that the gain control circuit 422a controls a variable gain $K_G$ value, but in other embodiments, the gain control circuit 422a may control the proportional gain $K_P$ and the integral gain $K_I$.

The DCO 430 may generate the oscillation signal OCS having a frequency corresponding to the frequency control signal FCS. The divider 440 may divide, by a division ratio, a frequency of the oscillation signal OS received from the DCO 430 to generate the feedback signal FDB. The divider 440 may provide the feedback signal FDB to the TDC 410.

Except for that a duty cycle of a digital loop filter 420b is controlled after multiplying an error signal ERR by a proportional gain $K_P$, FIG. 4B may be described with reference to FIG. 4A. Hereinafter, therefore, descriptions which are the same as or similar to descriptions given above with reference to FIG. 4A may be omitted.

The TDC 410 may transmit an error signal ERR to the digital loop filter 420b, based on a feedback signal FDB and a reference signal REF received from, for example, a crystal oscillator. The digital loop filter 420b may include a duty control circuit 421b, a gain control circuit 422b, and a filter circuit 423b. The duty control circuit 421b may adjust a duty cycle of the digital loop filter 420b, based on the error signal ERR received from a TDC 410 and/or the oscillation signal OS received from a DCO 430.

The duty control circuit 421b may control a duty cycle of the digital loop filter 420b, based on the error signal ERR and the oscillation signal OS. The gain control circuit 422b may control a gain of the digital loop filter 420b, based on the error signal ERR. In some embodiments, the gain control circuit 422b may calculate an auto correlation of the error signal ERR, and then, may increase or decrease a gain of the digital loop filter 420b, based on a value of the auto correlation.

The duty control circuit 421b and the gain control circuit 422b may transfer or receive control information CTR therebetween. The control information CTR may include information about whether duty cycle control or gain control on the digital loop filter 420b is completed. The filter circuit 423b may include a proportional amplifier 423b-1, an adder 423b-2, a gain amplifier 423b-3, an integral amplifier 423b-4, and an integrator 423b-5.

The proportional amplifier 423b-1 may multiply the error signal ERR by the proportional gain $K_P$ to generate a first middle signal MID1. The filter circuit 423b may vary a duty cycle of the first middle signal MID1, based on control by the duty control circuit 421b. For example, the filter circuit 423b may receive duty cycle information corresponding to $T_{REF}$ $T_{PW}$ from the duty control circuit 421b (where $T_{PW}$ may represent a duration time of a pulse, and $T_{REF}$ may represent a period of a reference signal). In this case, the filter circuit 423b may provide the first middle signal MID1 to the adder 423b-2 for $T_{PW}$ time in $T_{REF}$ time. On the other hand, the filter circuit 423b may not provide the first middle signal MID1 to the adder 423b-2 for a time except $T_{PW}$ time in $T_{REF}$ time.

The integral amplifier 423b-4 may multiply the error signal ERR by the integral gain $K_P$ to generate an internal signal INN. The integrator 423b-5 may accumulate the internal signal INN to generate a second middle signal MID2. The adder 423b-2 may receive the first middle signal MID1 and the second middle signal MID2 and may summate the first middle signal MID1 and the second middle signal MID2 to generate an addition signal ADD. Based on control by the gain control circuit 422b, the gain amplifier 423b-3 may multiply the addition signal ADD by a variable gain $K_G$ to generate the frequency control signal FCS.

Figure 5:
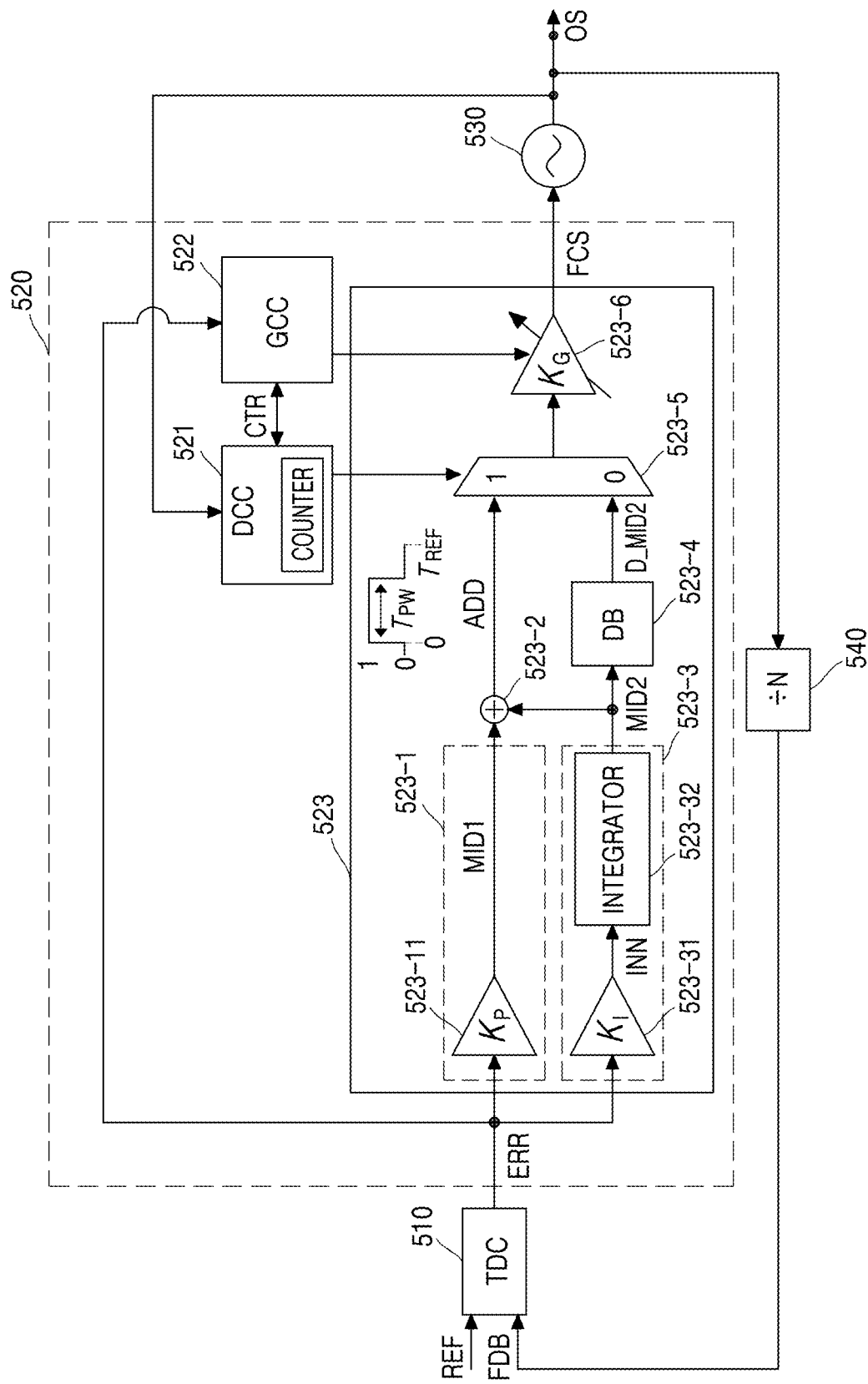
FIG. 5 is a block diagram for describing a structure of a digital PLL according to another embodiment.

FIG. 5 is a block diagram for describing a structure of a digital PLL according to another embodiment. Referring to FIG. 5, the digital PLL may include a TDC 510, a digital loop filter 520, a DCO 530, and a divider 540. The TDC 510 may transmit an error signal ERR to the digital loop filter 520, based on a feedback signal FDB and a reference signal REF received from, for example, a crystal oscillator. The error signal ERR may represent a phase difference between the feedback signal FDB and the reference signal REF.

The digital loop filter 520 may include a duty control circuit 521, a gain control circuit 522, and a filter circuit 523. The duty control circuit 521 may include a counter 521-1. The counter 521-1 may count the number of pulses of an oscillation signal OS received from the DCO 530. The duty control circuit 521 may control a duty cycle of the digital loop filter 520, based on the counted number of pulses of the oscillation signal OS.

For example, when a frequency of the oscillation signal OS is 100 MHz and a frequency of the reference signal REF is 1 MHZ, in a case where the duty control circuit 521 changes an active mode of the filter circuit 523 whenever the number of pulses of the oscillation signal OS is counted 50 times, a duty cycle of the digital loop filter 520 may be $$50 * \frac{0.01 \ \mu s}{1 \ \mu s} = 0.5.$$

The gain control circuit 522 may adjust a gain of the filter circuit 523, based on the error signal ERR. In some embodiments, the gain control circuit 522 may calculate an auto correlation of the error signal ERR, and then, may increase or decrease a gain of the digital loop filter 520, based on a value of the auto correlation.

The filter circuit 523 may include a proportional path 523-1, an adder 523-2, an integral path 523-3, a delay block 523-4, a multiplexer 523-5, and a gain amplifier 523-6. The filter circuit 523 may receive the error signal ERR and may generate a frequency control signal FCS, based on control by the duty control circuit 521 and/or the gain control circuit 522.

The proportional path 523-1 may include a proportional amplifier 523-11 having a proportional gain $K_P$. The proportional path 523-1 may multiply, by the proportional gain $K_P$, the error signal ERR received from the TDC 510 to generate the first middle signal MID1. The integral path 523-3 may include an integral amplifier 523-31 having an integral gain $K_I$ and an integrator 523-32. The integral amplifier 523-31 may multiply the error signal ERR by the integral gain $K_I$ to generate an internal signal INN. The integrator 523-32 may accumulate the internal signal INN to generate a second middle signal MID2.

The adder 523-2 may receive the first middle signal MID1 and the second middle signal MID2 and may summate the first middle signal MID1 and the second middle signal MID2 to generate an addition signal ADD. The addition signal ADD may include information about a current error signal ERR[n]. The delay block 523-4 may receive the second middle signal MID2 from the integral path 523-3 to generate a delayed second middle signal D_MID2. For example, the delay block 523-4 may delay the second middle signal MID2 by one period $T_{REF}$ of the reference signal REF to generate the delayed second middle signal D_MID2. The delayed second middle signal D_MID2 may not include the information about the current error signal ERR[n].

The multiplexer 523-5 may output one of the delayed second middle signal D_MID2 and the addition signal ADD, based on control by the duty control circuit 521. The filter circuit 523 may have an active mode or an inactive mode. The active mode may denote a case where the filter circuit 523 outputs the frequency control signal FCS in which the current error signal ERR[n] is reflected. The inactive mode may denote a case where the filter circuit 523 outputs the frequency control signal FCS in which the current error signal ERR[n] is not reflected.

The duty control circuit 521 may transfer a signal corresponding to '1' to the multiplexer 523-5, and thus, may control the multiplexer 523-5 to output the addition signal ADD. That is, the duty control circuit 521 may perform control so that the filter circuit 523 corresponds to the active mode. On the other hand, the duty control circuit 521 may transfer a signal corresponding to '0' to the multiplexer 523-5, and thus, may control the multiplexer 523-5 to output the delayed second middle signal D_MID2. That is, the duty control circuit 521 may perform control so that the filter circuit 523 corresponds to the inactive mode. However, this may be only an embodiment, and the duty control circuit 521 may transfer a signal corresponding to '0' to the multiplexer 523-5 to perform control so that the multiplexer 523-5 outputs the addition signal ADD and may transfer a signal corresponding to '1' to the multiplexer 523-5 to perform control so that the multiplexer 523-5 outputs the delayed second middle signal D_MID2.

Based on control by the gain control circuit 522, the gain amplifier 523-6 may multiply the addition signal ADD or the delayed second middle signal D_MID2 by a variable gain $K_G$ to generate the frequency control signal FCS. The DCO 530 may generate the oscillation signal OCS having a frequency corresponding to the frequency control signal FCS. The divider 540 may divide, by a division ratio, a frequency of the oscillation signal OS received from the DCO 530 to generate the feedback signal FDB. The divider 540 may provide the feedback signal FDB to the TDC 510.

Figure 6A:
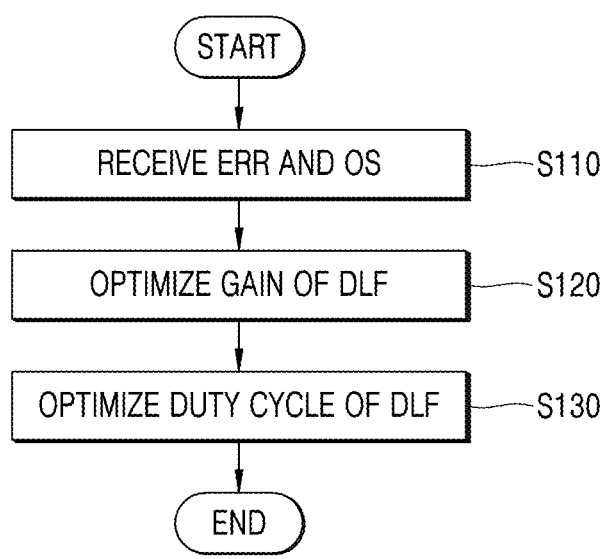
FIGS. 6A and 6B are flowcharts for describing the one-shot control of a digital PLL according to an embodiment.
Figure 6B:
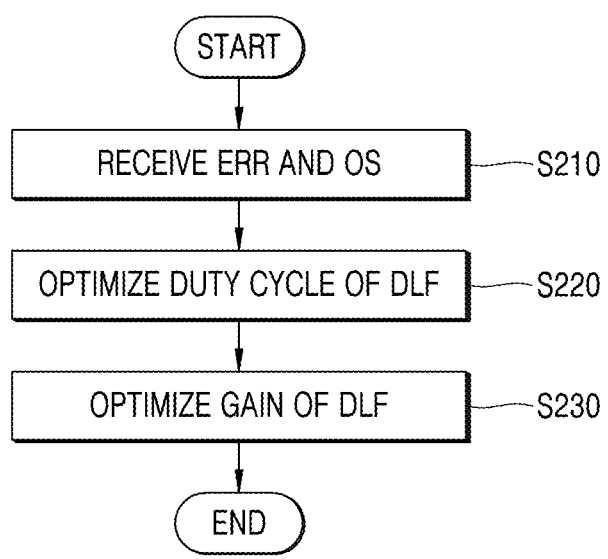

FIGS. 6A and 6B are flowcharts for describing the one-shot control of a digital PLL according to an embodiment. FIGS. 6A and 6B may be described with reference to FIG. 3 described above. FIG. 6A illustrates one-shot control where gain control is first performed, and FIG. 6B illustrates one-shot control where duty cycle control is first performed. In an embodiment, the one-shot control may denote an operation of performing the gain optimization of a digital loop filter and/or the duty cycle optimization of the digital loop filter once.

Referring to FIG. 6A, one-shot control where gain control is first performed may include operations S110 to S130. In operation S110, an error signal and an oscillation signal may be received. For example, referring to FIG. 3, the gain/duty control circuit 321 may receive the error signal ERR from the TDC 310 and may receive the oscillation signal OS from the DCO 330.

In operation S120, a gain of the digital loop filter 320 may be optimized. The gain/duty control circuit 321 may adjust a gain of the filter circuit 322, based on the error signal ERR. In some embodiments, the gain/duty control circuit 321 may calculate an auto correlation of the error signal ERR, and then, may increase or decrease a gain of the digital loop filter 320, based on a value of the auto correlation. For example, when an auto correlation of the error signal ERR is a negative number, the gain/duty control circuit 321 may decrease a gain of the digital loop filter 320. On the other hand, when the auto correlation of the error signal ERR is a positive number, the gain/duty control circuit 321 may increase a gain of the digital loop filter 320. Also, when the auto correlation of the error signal ERR is 0, this may denote that the RMS jitter of the oscillation signal OS is minimally reduced.

Accordingly, the gain/duty control circuit 321 may obtain a gain of the digital loop filter 320 having an auto correlation value closest to 0 while varying a gain of the digital loop filter 320 to be within a controllable range. The auto correlation of the error signal ERR being closest to 0 may denote that a quantization error is offset. Also, that the quantization error which is a noise source of the digital PLL is offset may denote that RMS jitter of the digital PLL is reduced. Accordingly, the gain/duty control circuit 321 may optimize a gain of the digital loop filter 320 with a gain value of the digital loop filter 320 having the auto correlation value closest to 0.

In operation S130, a duty cycle of the digital loop filter 320 may be optimized. The gain/duty control circuit 321 may control a duty cycle of the digital loop filter 320, based on the counted number of pulses of the oscillation signal OS. For example, when a frequency of the oscillation signal OS is 100 MHz and a frequency of the reference signal REF is 1 MHZ, in a case where the gain/duty control circuit 321 changes the active mode of the filter circuit 322 whenever the number of pulses of the oscillation signal OS is counted 50 times, a duty cycle of the digital loop filter 320 may be 50* 0.01 µs/1 µs=0.5.

In some embodiments, the gain/duty control circuit 321 may calculate the auto correlation of the error signal ERR, and then, may increase or decrease a gain of the digital loop filter 320, based on a value of the auto correlation. The gain/duty control circuit 321 may obtain a duty cycle of the digital loop filter 320 having the auto correlation value closest to 0 while varying a duty cycle of the digital loop filter 320 to be within a controllable range. Accordingly, the gain/duty control circuit 321 may optimize a duty cycle of the digital loop filter 320 with a duty cycle value of the digital loop filter 320 having the auto correlation value closest to 0.

Referring to FIG. 6B, one-shot control where duty cycle control is first performed may include operations S210 to S230. In FIG. 6B, except for that the duty cycle control of the digital loop filter is performed prior to the gain control of the digital loop filter, descriptions which are the same as or similar to the descriptions of FIG. 6A may be omitted. In operation S210, the error signal ERR and the oscillation signal OS may be received. For example, referring to FIG. 3, the gain/duty control circuit 321 may receive the error signal ERR from the TDC 310 and may receive the oscillation signal OS from the DCO 330. In operation S220, a duty cycle of the digital loop filter may be optimized. The gain/duty control circuit 321 may control a duty cycle of the digital loop filter 320, based on the counted number of pulses of the oscillation signal OS. In operation S230, a gain of the digital loop filter 320 may be optimized. The gain/duty control circuit 321 may adjust a gain of the filter circuit 322, based on the error signal ERR.

Figure 7A:
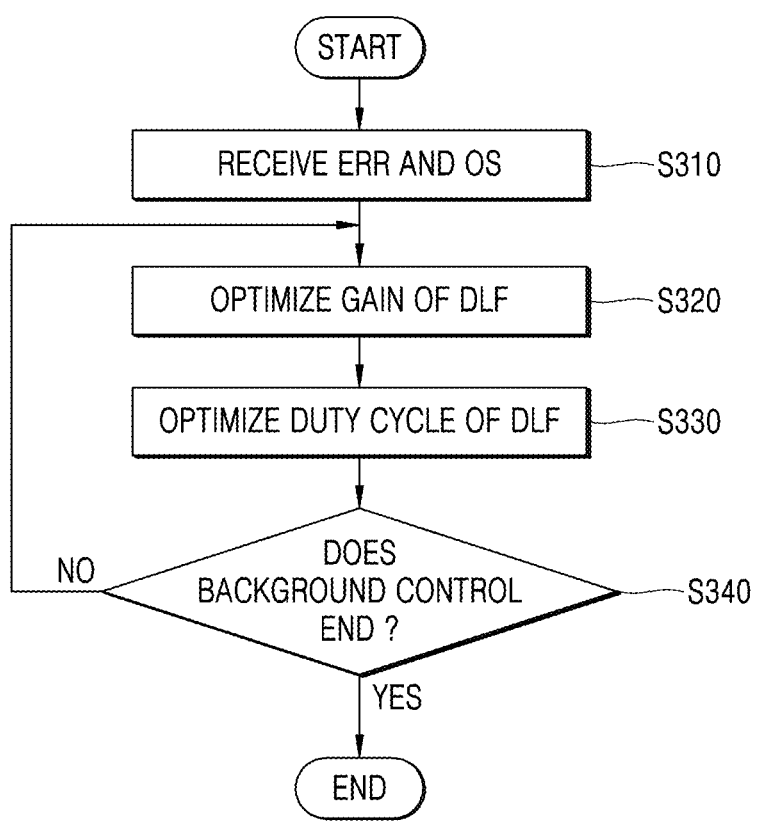
FIGS. 7A and 7B are flowcharts for describing the background control of a digital PLL according to an embodiment.
Figure 7B:
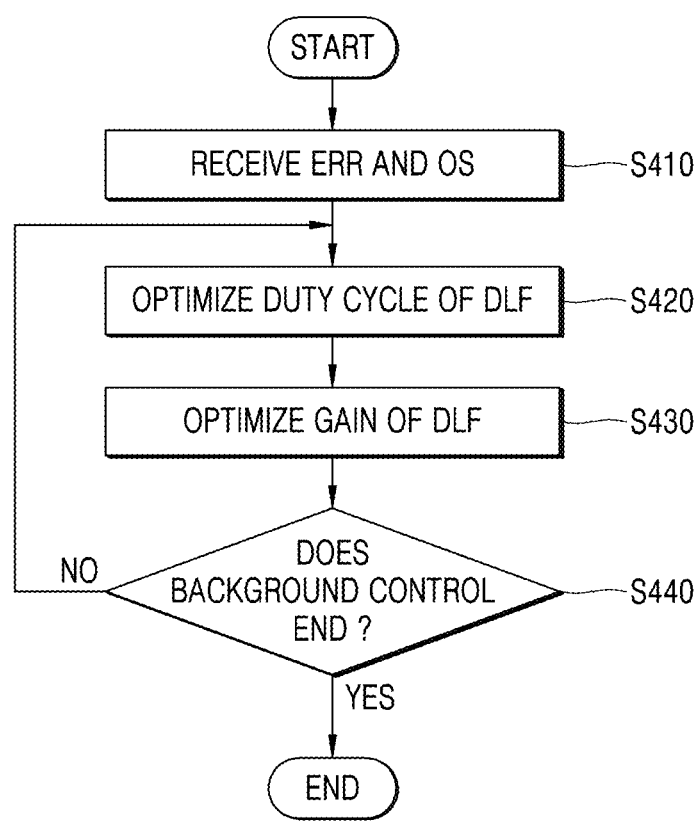

FIGS. 7A and 7B are flowcharts for describing the background control of a digital PLL according to an embodiment. FIGS. 7A and 7B may be described with reference to FIG. 3 described above. Unlike FIGS. 6A and 6B, FIGS. 7A and 7B may denote an operation of repeatedly performing the background control, namely, the gain optimization of a digital loop filter and/or the duty cycle optimization of the digital loop filter. In FIGS. 7A and 7B, except for that the gain control of the digital loop filter and/or the duty cycle control of the digital loop filter are/is repeatedly performed, descriptions which are the same as or similar to the descriptions of FIGS. 6A and 6B may be omitted.

FIG. 7A illustrates background control where gain control is first performed, and FIG. 7B illustrates background control where duty cycle control is first performed. Referring to FIG. 7A, background control where gain control is first performed may include operations S310 to S340. In operation S310, the error signal ERR and the oscillation signal OS may be received. For example, referring to FIG. 3, the gain/duty control circuit 321 may receive the error signal ERR from the TDC 310 and may receive the oscillation signal OS from the DCO 330.

In operation S320, a gain of the digital loop filter 320 may be optimized. The gain/duty control circuit 321 may adjust a gain of the filter circuit 322, based on the error signal ERR. The gain/duty control circuit 321 may obtain a gain of the digital loop filter 320 having an auto correlation value closest to 0 while varying a gain of the digital loop filter 320 to be within a controllable range. The gain/duty control circuit 321 may optimize a gain of the digital loop filter 320 with a gain value of the digital loop filter 320 having the auto correlation value closest to 0.

In operation S330, a duty cycle of the digital loop filter 320 may be optimized. In some embodiments, the gain/duty control circuit 321 may calculate the auto correlation of the error signal ERR, and then, may increase or decrease a duty cycle of the digital loop filter 320, based on a value of the auto correlation. The gain/duty control circuit 321 may obtain a duty cycle of the digital loop filter 320 having the auto correlation value closest to 0 while varying a duty cycle of the digital loop filter 320 to be within a controllable range. Accordingly, the gain/duty control circuit 321 may optimize a duty cycle of the digital loop filter 320 with a duty cycle value of the digital loop filter 320 having the auto correlation value closest to 0.

In operation S340, whether to end the background control may be determined. The gain/duty control circuit 321 may determine whether to perform the duty cycle or gain control of the digital loop filter 320. Although the duty cycle or gain of the digital loop filter 320 is optimized, when RMS jitter of the digital PLL increases due to external noise, it may be needed to repeatedly optimize the duty cycle and/or gain of the digital loop filter 320. When the background control on the digital loop filter 320 does not end, operations S320 to S340 may be repeatedly performed. Referring to FIG. 7B, background control where duty cycle control is first performed may include operations S410 to S440. In FIG. 7B, except for that the duty cycle control of the digital loop filter is performed prior to the gain control of the digital loop filter, descriptions which are the same as or similar to the descriptions of FIG. 7A may be omitted.

In operation S410, the error signal ERR and the oscillation signal OS may be received. For example, referring to FIG. 3, the gain/duty control circuit 321 may receive the error signal ERR from the TDC 310 and may receive the oscillation signal OS from the DCO 330. In operation S420, a duty cycle of the digital loop filter may be optimized. The gain/duty control circuit 321 may control a duty cycle of the digital loop filter 320, based on the counted number of pulses of the oscillation signal OS. In operation S430, a gain of the digital loop filter 320 may be optimized. The gain/duty control circuit 321 may adjust a gain of the filter circuit 322, based on the error signal ERR. In operation S440, whether to end the background control may be determined. When the background control on the digital loop filter 320 does not end, operations S420 to S440 may be repeatedly performed.

Figure 8:
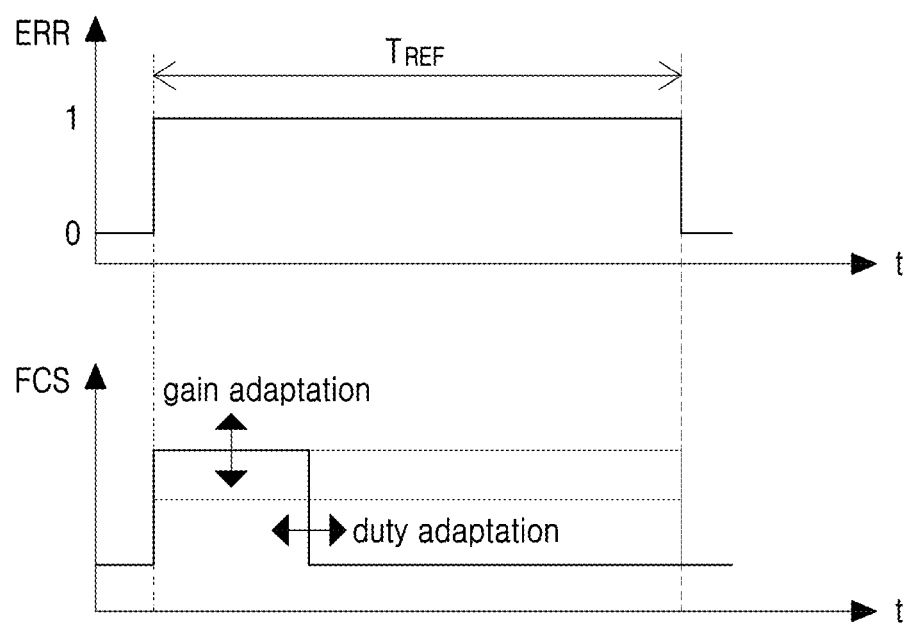
FIG. 8 is a diagram for describing a single bit error signal and a frequency control signal, according to an embodiment.

FIG. 8 is a diagram for describing a single bit error signal and a frequency control signal, according to an embodiment. FIG. 8 may be described with reference to FIG. 1. The TDC 110 may include a comparator, and the comparator may generate the error signal ERR representing a phase difference between the feedback signal FDB and the reference signal REF, based on a difference between the feedback signal FDB and the reference signal REF. To provide a detailed description, when a difference between the feedback signal FDB and the reference signal REF occurs, the TDC 110 may generate the error signal ERR of 0. The TDC 110 may output the error signal ERR where a magnitude of a pulse is constant but a pulse width varies based on a difference between two signals and a sign is determined based on a signal having a higher level among the two signals. According to an embodiment, the error ERR may have a value of 0 or 1, and thus, may be referred to as a single-bit error signal.

When there is a phase difference between the feedback signal FDB and the reference signal REF, the TDC 110 may generate the error signal ERR having a pulse width equal to a period where there is the difference. FIG. 8 illustrates a case where there is the phase difference between the feedback signal FDB and the reference signal REF during a period $T_{REF}$ of the reference signal REF.

The digital loop filter 120 may receive the error signal ERR and the oscillation signal OS and may generate a frequency control signal FCS for controlling a frequency of the oscillation signal OS, based on the error signal ERR and/or the oscillation signal OS. The digital loop filter 120 may adjust at least one of a gain and a duty cycle of the digital loop filter 120, based on the error signal ERR and/or the oscillation signal OS. As a result, a gain and/or duty cycle-adjusted frequency control signal FCS may be generated during the period $T_{REF}$ of the reference signal REF.

Figure 9A:
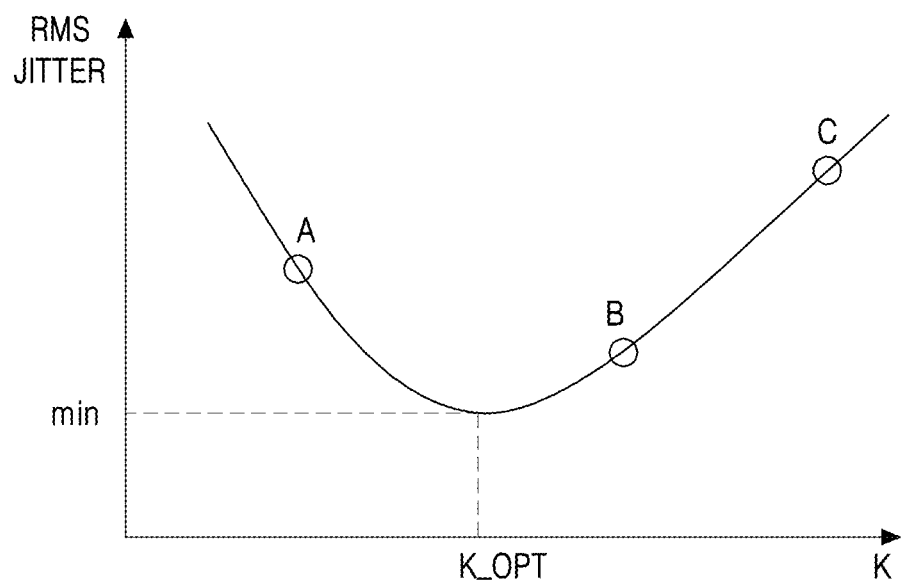
FIGS. 9A and 9B are diagrams illustrating a relationship between RMS jitter and error correction gain of a digital PLL according to an embodiment.
Figure 9B:
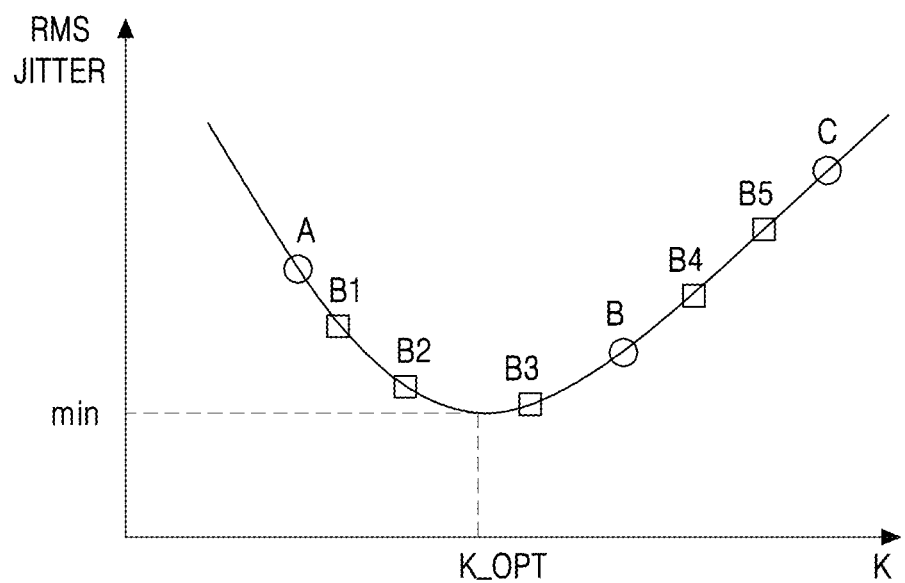

FIGS. 9A and 9B are diagrams illustrating a relationship between RMS jitter and an error correction gain K of a digital PLL according to an embodiment. In an embodiment, the error correction gain K may be a function of various variables which may affect the RMS jitter in the digital PLL. For example, referring to FIG. 3, a duration time of a pulse $T_{PW}$, a variable gain $K_G$, and a gain of a TDC, and a gain of a DCO may be variables which may affect the RMS jitter. The error correction gain K may have a positive correlation with various variables which may affect the RMS jitter. For example, when a variable gain $K_G$ value increases, the error correction gain K may increase also.

FIG. 9A illustrates a case where only a gain of a digital loop filter is controlled, and FIG. 9B illustrates a case where all of the gain and a duty cycle of the digital loop filter are controlled. FIGS. 9A and 9B may be described with reference to FIG. 3 described above. Referring to FIG. 9A, values of A, B, and C points may be obtained by adjusting a variable gain $K_G$ of the digital loop filter 320. Due to a limitation of the number of bits for controlling the variable gain $K_G$, the gain/duty control circuit 321 may be difficult to precisely control the variable gain $K_G$. For example, when the number of bits for controlling the variable gain $K_G$ is 2, the A point may be a point corresponding to '00', the B point may be a point corresponding to '01', and the C point may be a point corresponding to '10'. Accordingly, a point having lowest RMS jitter among three points described above may be the B point. However, the B point may be higher in RMS jitter than an optimal K value K_OPT where the RMS jitter is minimized. That is, when only the variable gain $K_G$ of the digital loop filter 320 is controlled, the RMS jitter may not be lowered to be less than the B point.

Referring to FIG. 9B, as described above with reference to FIG. 9A, values of A, B, and C points may be obtained by adjusting the variable gain $K_G$ of the digital loop filter 320. The gain/duty control circuit 321 may fix the variable gain $K_G$ to the B point having lowest RMS jitter among the A, B, and C points, and then, may adjust of a duty cycle of the digital loop filter 320. The gain/duty control circuit 321 may decrease a duty cycle to obtain B1 to B3 point values. Also, the gain/duty control circuit 321 may increase a duty cycle to obtain B4 and B5 point values. The gain/duty control circuit 321 may control a duty cycle of the digital loop filter 320 to a duty cycle corresponding to the B3 point having lowest RMS jitter among the B1 to B5 points. Comparing with FIG. 9A where only the gain of the digital loop filter 320 is adjusted, in FIG. 9B where all of the gain and the duty cycle of the digital loop filter 320 are controlled, the gain/duty control circuit 321 may further reduce RMS jitter of the digital PLL.

Figure 10:
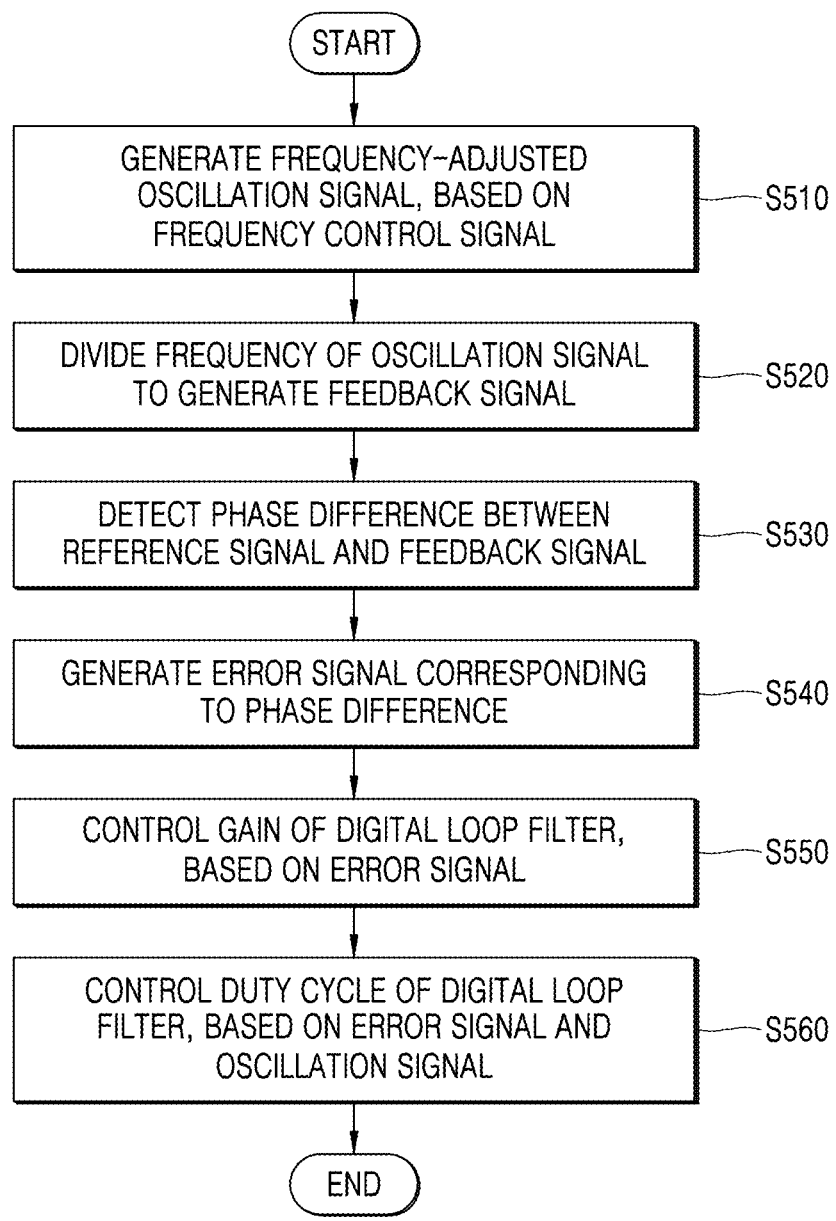
FIG. 10 is a diagram for describing an operating method of a digital loop filter, according to an embodiment.

FIG. 10 is a diagram for describing an operating method of a digital loop filter, according to an embodiment. FIG. 10 may be described with reference to FIG. 3. An operating method of a digital PLL may include operations S510 to S560. In operation S510, the oscillation signal OS where a frequency is adjusted based on the frequency control signal FCS may be generated. For example, the DCO 330 may receive the frequency control signal FCS and may generate the oscillation signal OS having a frequency corresponding to the frequency control signal FCS.

In operation S520, the DCO 330 may divide a frequency of the oscillation signal OS to generate the feedback signal FDB. For example, the divider 140 may divide a frequency of the oscillation signal OS, which is a high frequency signal, and thus, may provide the TDC 310 with the feedback signal FDB having a frequency which is relatively lower than that of the oscillation signal OS. In operation S530, a phase difference between the feedback signal FDB and the reference signal REF may be detected. For example, the TDC 310 may include a comparator, and the comparator may generate the error signal ERR representing a phase difference between the feedback signal FDB and the reference signal REF, based on a difference between the feedback signal FDB and the reference signal REF. In operation S540, the error signal ERR corresponding to the phase difference may be generated. For example, the TDC 310 may generate the error signal ERR corresponding to the phase difference which is defected in operation S530. The error signal ERR may represent a phase difference between the feedback signal FDB and the reference signal REF. In operation S550, a gain of the digital loop filter 320 may be controlled based on the error signal ERR. For example, the gain/duty control circuit 321 may adjust a gain of the filter circuit 322, based on the error signal ERR. In operation S560, a duty cycle of the digital loop filter 320 may be controlled based on the error signal ERR and the oscillation signal OS. In some embodiments, operation S560 may include an operation of generating the first middle signal MID1 proportional to the error signal ERR and an operation of accumulating the error signal ERR to generate the second middle signal MID2.

The generating the first middle signal MID1 proportional to the error signal ERR may include an operation of multiplying the error signal ERR by the proportional gain $K_G$ to generate the first middle signal MID1. Also, the operation of accumulating the error signal ERR to generate the second middle signal MID2 may include an operation of multiplying the error signal ERR by the integral gain $K_I$ to generate the internal signal INN and an operation of accumulating the internal signal INN to generate the second middle signal MID2.

In some embodiments, operation S560 may include an operation of delaying the second middle signal MID2 to generate the delayed second middle signal D_MID2, an operation of summating the first middle signal MID1 and the second middle signal MID2 to generate the addition signal ADD, and an operation of outputting one of the delayed second middle signal D_MID2 and the addition signal ADD through the multiplexer 322-5. In other embodiments, operation S560 may include an operation of controlling a duty cycle to decrease the RMS jitter of the oscillation signal OS. In other embodiments, operation S560 may include an operation of counting the number of pulses of the oscillation signal OS and an operation of controlling a duty cycle of the digital loop filter 320, based on the number of pulses of the oscillation signal OS.

Figure 11:
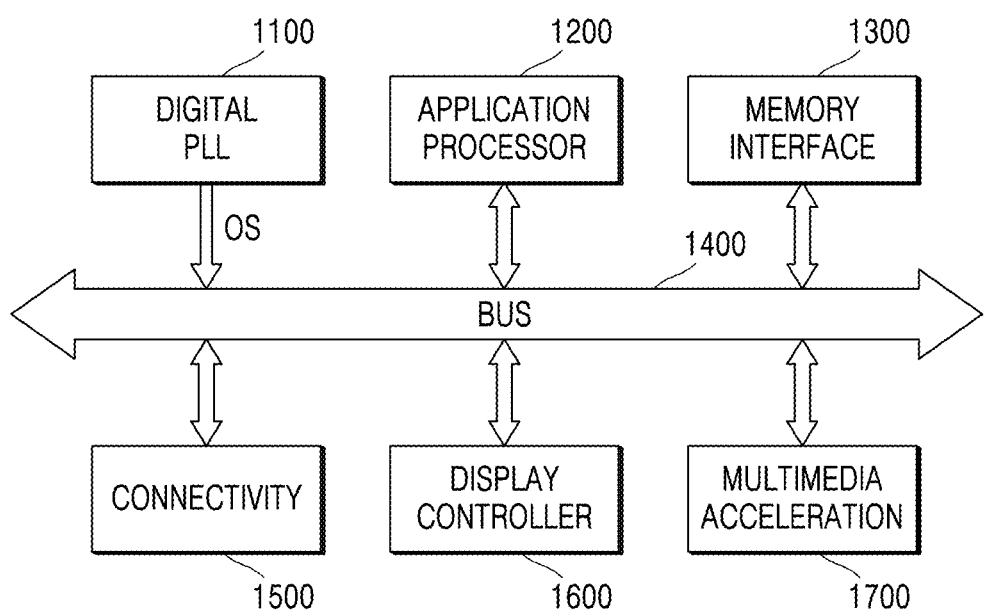
FIG. 11 is a diagram for describing a system on chip (SOC) including a PLL according to an embodiment.

FIG. 11 is a diagram for describing an SOC including a PLL according to an embodiment. Referring to FIG. 11, the SOC may include a digital PLL 1100, an application processor 1200, a memory interface 1300, a bus 1400, a connectivity 1500, a display controller 1600, and a multimedia acceleration 1700. The SOC may be applied to laptop computers, mobile phones, smartphones, tablet personal computers (PCs), personal digital assistants (PDAs), enterprise digital assistants (EDAs), digital still cameras, digital video cameras, portable multimedia players (PMPs), personal navigation devices or portable navigation devices (PNDs), handheld game consoles, or e-books. A digital PLL 1100 may adjust a gain and/or a duty cycle of a digital loop filter, thereby decreasing RMS jitter of the digital PLL 1100. Also, the digital PLL 1100 may provide the RMS jitter-adjusted oscillation signal OS to the bus 1400.

The application processor 1200 may control the memory interface 1300, the connectivity 1500, the display controller 1600, and the multimedia acceleration 1700 through the bus 1400. The memory interface 1300 may include an internal memory device, and moreover, may include a memory controller capable of interfacing an external memory device. The display controller 1600 may transfer data, which is to be displayed on a display, to the display. The connectivity 1500 may include a general purpose input/output (GPIO) interface, a serial peripheral interface (SPI) bus, and/or a universal serial bus (USB) on-the-go (USB OTG). The multimedia acceleration 1700 may include a camera interface, a multi format CODEC, a video pre/post-processor, and/or joint photographic exports group (JPEG).

Hereinabove, embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept. Accordingly, the spirit and scope of the inventive concept may be defined based on the spirit and scope of the following claims.

What is claimed is:

1. A digital phase-locked loop (PLL), comprising:
    a digitally controlled oscillator (DCO) configured to generate an oscillation signal having a frequency that is adjustable in response to a frequency control signal;
    a divider configured to generate a feedback signal in response to dividing a frequency of the oscillation signal;
    a time-to-digital converter (TDC) configured to detect a phase difference between a reference signal and the feedback signal, and generate an error signal based on the phase difference; and
    a digital loop filter configured to generate the frequency control signal in response to the error signal and the oscillation signal,
    wherein the digital loop filter comprises:
    a gain/duty control circuit configured to control at least one of a gain and a duty cycle of the digital loop filter, based on the error signal and the oscillation signal; and
    a filter circuit configured to filter out noise of the error signal and generate the frequency control signal, based on control by the gain/duty control circuit.

2. The digital PLL of claim 1, wherein the digital loop filter circuit comprises:
    a proportional path configured to generate a first middle signal having a value that is proportional to the error signal; and
    an integral path configured to generate a second middle signal in response to accumulating the error signal.

3. The digital PLL of claim 2,
    wherein the proportional path is configured to generate the first middle signal in response to multiplying the error signal by a proportional gain; and
    wherein the integral path comprises: an integral amplifier configured to generate an internal signal in response to multiplying the error signal by an integral gain, and an integrator configured to generate the second middle signal in response to accumulating the internal signal.

4. The digital PLL of claim 3, wherein the digital loop filter circuit further comprises:
    a delay block configured to delay the second middle signal to generate a delayed second middle signal;
    an adder configured to generate an addition signal in response to summing the first middle signal and the second middle signal; and
    a multiplexer configured to output a selected one of the delayed second middle signal and the addition signal, based on control of a gain/duty control circuit.

5. The digital PLL of claim 4, wherein the gain/duty control circuit is configured to control the multiplexer to output the addition signal, when the digital loop filter is in an active mode.

6. The digital PLL of claim 4, wherein the gain/duty control circuit is configured to control the multiplexer to output the delayed second middle signal, when the digital loop filter is in an inactive mode.

7. The digital PLL of claim 4, wherein the gain/duty control circuit is configured to control at least one of a gain and a duty cycle of the digital loop filter to reduce root mean square (RMS) jitter of the oscillation signal.

8. The digital PLL of claim 4, wherein the gain/duty control circuit is configured to control at least one of a gain and a duty cycle of the digital loop filter, based on an auto correlation of the error signal.

9. The digital PLL of claim 4, wherein the gain/duty control circuit comprises a counter configured to count the number of pulses of the oscillation signal; and wherein the gain/duty control circuit is configured to control a duty cycle of the digital loop filter, based on the number of pulses of the oscillation signal.

10. A system on chip (SOC), comprising:
a digital phase locked loop; and
an application processor configured to operate in response to an oscillation signal generated by the digital phase locked loop;
wherein the digital phase locked loop comprises:
a digitally controlled oscillator (DCO) configured to generate an oscillation signal having an adjustable frequency based on a frequency control signal;
a divider configured to divide a frequency of the oscillation signal to generate a feedback signal;
a time-to-digital converter (TDC) configured to detect a phase difference between a reference signal and the feedback signal and generate an error signal corresponding to the phase difference; and
a digital loop filter configured to receive the error signal to generate the frequency control signal; and
wherein the digital loop filter comprises:
a filter circuit configured to generate the frequency control signal based on the error signal; and
a gain/duty control circuit configured to control at least one of a gain and a duty cycle of the digital loop filter.

11. The SOC of claim 10, wherein the filter circuit further comprises:
a proportional path configured to generate a first middle signal proportional to the error signal; and
an integral path configured to accumulate the error signal to generate a second middle signal.

12. The SOC of claim 10, wherein the gain/duty control circuit is configured to control at least one of the gain and the duty cycle of the digital loop filter to reduce root mean square (RMS) jitter of the oscillation signal.

13. The SOC of claim 10, wherein the gain/duty control circuit is configured to control at least one of the gain and the duty cycle of the digital loop filter, based on an auto correlation of the error signal.

14. The SOC of claim 10, wherein the gain/duty control circuit comprises a counter configured to count the number of pulses of the oscillation signal; and wherein the gain/duty control circuit is configured to control the duty cycle of the digital loop filter, based on the number of pulses of the oscillation signal.

* * * * *